United States Patent

Banerjee et al.

(10) Patent No.: US 7,049,898 B2
(45) Date of Patent: May 23, 2006

(54) STRAINED-SILICON VOLTAGE CONTROLLED OSCILLATOR (VCO)

(75) Inventors: Gaurab Banerjee, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,307

(22) Filed: Sep. 30, 2003

(65) Prior Publication Data

US 2005/0068117 A1 Mar. 31, 2005

(51) Int. Cl.
*H03B 5/12* (2006.01)

(52) U.S. Cl. .............. 331/108 C; 331/36 C; 331/117 FE; 331/175; 331/177 V

(58) Field of Classification Search .......... 331/36 C, 331/108 C, 117 R, 117 FE, 117 D, 175, 177 R, 331/177 V; 257/18, 19, 192

See application file for complete search history.

(56) References Cited

U.S. PATENT DOCUMENTS

| | | |
|---|---|---|
| 5,672,995 A | 9/1997 | Hirase et al. |
| 2003/0102498 A1* | 6/2003 | Braithwaite et al. ........ 257/288 |
| 2003/0127697 A1 | 7/2003 | Ohta et al. |

OTHER PUBLICATIONS

Hwang J R et al, "Performance of 70nm Strained-Silicon CMOS Devices", 2003 Symposium on VLSI Technology. Digest of Technical Papers, (IEEE Cat No. 03CH37407), Jun. 10, 2003, pp. 103-104, XP002314312, Japan.
International Search Report, International App. No. PCT/US2004/032460, Applicant Ref. No. P16088PCT, Completion Date: Jan. 21, 2005, Date Mailed: Feb. 15, 2005.

* cited by examiner

*Primary Examiner*—David Mis
(74) *Attorney, Agent, or Firm*—John F. Travis

(57) ABSTRACT

A strained-silicon voltage controlled oscillator (VCO) includes a first p-channel metal oxide semiconductor (PMOS) device having a strained-silicon layer coupled to a second PMOS device having a strained-silicon layer.

19 Claims, 4 Drawing Sheets

STRAINED-SILICON VOLTAGE CONTROLLED OSCILLATOR (VCO)

TECHNICAL FIELD

Embodiments of the present invention are generally directed to electronic devices and, more particularly, to strained-silicon voltage controlled oscillator (VCO), although the scope of the invention is not limited in this regard.

BACKGROUND

Voltage controlled oscillators (VCO's) have long been used as components within phase locked loops (PLL's) and synthesizers, which in turn have had wide applicability, particularly in the area of clock frequency generation. PLL's for example, are commonly used in a feedback configuration to generate an output clock signal having a desired output frequency that is derived from an input reference signal. More specifically, PLL's/synthesizers are often used in microprocessors and in wireless transmitters and receivers to achieve desired operating/output frequencies based upon relatively low frequency input signals.

With the continued push towards miniaturization of electronic circuits and devices coupled with the demand for increased operating speeds of those devices, operating noise has become a significant and limiting factor in the design of such circuits and devices. In particular, flicker noise has become a dominant source of noise in silicon based metal oxide semiconductor field effect transistor (MOSFET) devices at low frequencies. In fact, flicker noise often limits the achievable dynamic range for baseband/low-frequency circuits and is a critical design constraint in radio frequency (RF) circuits. In VCOs, device-level flicker noise gets up-converted to phase noise. This can result in adjacent channel interference in communication systems.

Flicker noise in MOSFETs is due primarily to the random trapping and detrapping of charge carriers near the Si—SiO$_2$ interface. This carrier trapping/detrapping process acts to modulate the channel carrier density and causes fluctuations in the surface mobility of the charge carriers. Because of the slow time constants of the oxide traps and the surface states, the noise spectral density of flicker noise is inversely proportional to frequency, and therefore is commonly called 1/f noise.

Many VCOs typically use p-channel metal oxide semiconductors (PMOS transistors) cross-coupled to n-channel metal oxide semiconductors (NMOS transistors), as well as an NMOS tail current source and an on-chip inductor and varactor. Although there can be a variety of factors contributing to the generation of phase noise in VCOs, flicker noise in the tail current source and cross-coupled MOS devices has been found to be the dominating contributor to noise. Additionally, transceiver systems built using typical VCOs either receive interference from adjacent channels, or have a high residual bit error rate due to integrated phase noise outside the PLL/synthesizer loop-bandwidth.

Although a variety of noise suppression techniques have been attempted in the past, these approaches all require additional components or processing steps thus increasing cost and design time.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF ILLUSTRATED EMBODIMENTS

Figure 1:
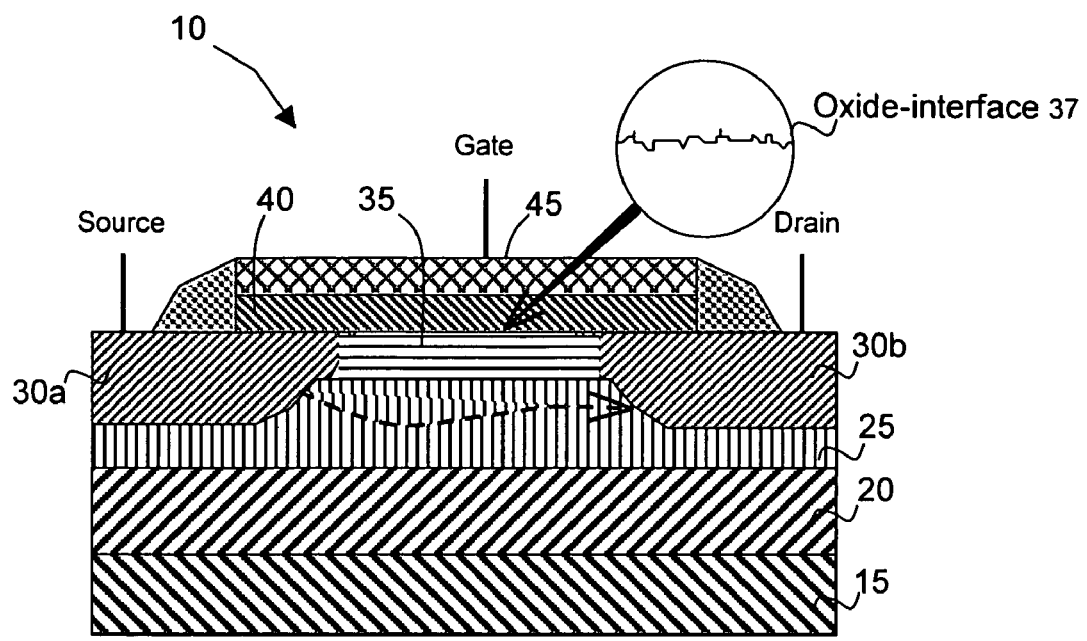
FIG. 1 illustrates an exemplary strained-silicon PMOS device, in which carrier transport takes place below a heterojunction formed at a Si/SiGe (relaxed) interface.

In the following detailed description, numerous specific details are set forth in order to provide a thorough understanding of embodiments of the present invention. However, those skilled in the art will understand that such embodiments may be practiced without these specific details. In other instances, well known methods, procedures, components, and circuits have not been described in detail.

Although various discrete operations will be described herein, the mere order of description should not be construed as to imply that these operations are necessarily performed in the order they are presented.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising", "including", "having", and the like, as used in the present application, are intended to be synonymous.

In accordance with one embodiment of the invention, a voltage controlled oscillator (VCO) containing at least one strained-silicon MOSFET device is described herein. More specifically, in accordance with one embodiment of the invention, a VCO containing strained-silicon PMOS devices is utilized in conjunction with a control bias to yield increased buried channel conduction within the PMOS devices so as to reduce flicker noise and derivative phase noise within the VCO.

As used herein, strained-silicon refers to silicon that is "stretched out" due to the natural tendency of atoms inside compounds to align with one another, although the invention is not limited in this regard. According to one example embodiment, silicon may be deposited on top of a substrate having atoms that are spaced farther apart than the silicon atoms, the atoms in silicon stretch to line up with the atoms beneath, effectively "straining" the silicon. In strained-silicon, electrons typically experience less resistance and can therefor flow faster than electrons in non-strained-silicon. Unfortunately, however, due at least in part to the increase in electron mobility/conduction, the use of strained-silicon in MOSFET devices may result in increased flicker noise in devices due to a tendency for increased trapping and detrapping of charges in oxide traps near the oxide interface of the device.

In one embodiment of the invention, a negative voltage bias is applied to the substrate/body (also referred to as a back gate) of a strained-silicon PMOS device to attract carrier transport (e.g., holes) away from the oxide interface (and corresponding traps) of the PMOS device resulting in decreased flicker noise in the PMOS transistors and decreased phase noise in VCOs employing such PMOS transistors. The bias may be fixed and/or steady or the bias may vary with time. In one embodiment, by applying such a bias, a majority of the carrier transport is forced to occur in a buried silicon-germanium SiGe channel below the strained-silicon layer resulting in increased majority carrier flow and increased flicker noise. Such buried channel transport is typically undesirable in conventional devices since the further the charge carrier is away from the oxide interface, the less control one typically has over the carrier flow. However, due at least in part to the positive feedback arrangement associated with oscillators, the effect of decreased gate control is minimal.

FIG. 1 illustrates an example strained-silicon PMOS device 10, in which carrier transport may take place below a heterojunction formed at a Si/SiGe (relaxed) interface. As shown in FIG. 1, PMOS device 10 includes a base silicon substrate 15 (also referred to as the PMOS device body) having a variety of epitaxial layers disposed thereon. The term substrate, as used herein, refers to the physical object, which is the basic workpiece that is transformed by various process operations into a desired microelectronic configuration. A substrate may be made of semiconducting, non-semiconducting, or combinations of semiconducting and non-semiconducting materials.

In FIG. 1, the PMOS device 10 includes a buffer layer of graded SiGe 20 that is formed on a Si substrate 15, although the invention is not limited in this respect. In one embodiment, the SiGe layer 20 represents a $Si_{1-x}Ge_x$ buffer layer having a graded Ge composition. A layer of relaxed SiGe 25 is formed on the graded SiGe layer 20. In one embodiment, a SiGe composition of $Si_{0.7}Ge_{0.3}$ is utilized for the SiGe layer 20. The source and drain regions 30a and 30b represent P-type wells formed within the Si substrate 15 prior to epitaxy. A strained-Si layer 35 is then formed on the relaxed SiGe layer 25 by e.g., the application f Si on the relaxed SiGe layer 25. Next, an oxide layer 40 is formed on the strained-silicon layer 35 resulting in traps within the oxide interface 37 as illustrated in the magnified view of FIG. 1. In one embodiment, the oxide layer 40 may be composed of $SiO_2$. Lastly, a poly-silicon gate 45 is formed on the oxide layer 40, and source, gate and drain terminals are constructed thereon as shown. In one embodiment, a fourth terminal/back gate (not shown) is associated with the body/Si substrate 15 to facilitate application of a voltage bias to the body of PMOS device 10.

The source and drain terminals are coupled to source region 30a and drain region 30b, respectively. Source/drain terminals refer to the terminals within a FET (e.g., both N-channel and P-channel), between which conduction occurs under the influence of an electric field subsequent to the inversion of the semiconductor surface under the influence of the electric field resulting from a voltage applied to a gate terminal. In the event the source and drain terminals are fabricated such that they are geometrically symmetrical, the terms "source" and drain" may be used interchangeably.

In accordance with one embodiment of the invention, conduction between the source region 30a and the drain region 30b occurs as buried channel transport below the oxide interface 37. However, it should be noted that the buried channel transport, described herein with respect to various embodiments of the present invention, is agnostic to the process adopted to generate strain in a corresponding device (e.g., PMOS device 10) or to the sequence of epitaxial layers used to achieve the same. Thus, although the PMOS device of FIG. 1 has been described with respect to a particular composition and structure, other such compositions and structures may nonetheless be practiced without departing from the spirit and scope of the invention. For example, the silicon of PMOS device 10 may be strained through a variety of mechanisms including, but not limited to biaxial in-plane tensile strain using epitaxial SiGe, strain by tensile film, and strain by mechanical force, as e.g., described in the paper entitled "A 90 nm logic technology featuring 50 nm strained silicon channel transistors, 7 layers of Cu interconnects, low k ILD, and 1 $\mu m^2$ SRAM cell", Thompson, S. et al. Electron Devices Meeting, 2002. IEDM '02. Digest. International, 8–11 Dec. 2002, Page(s): 61–64.

Figure 2:
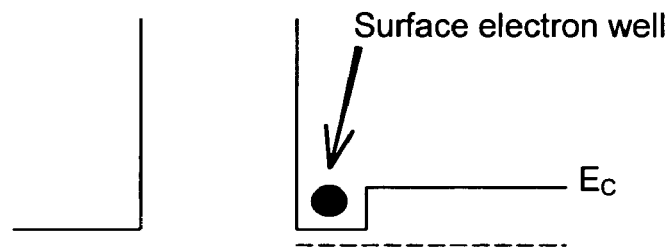
FIG. 2 illustrates an equilibrium band-diagram for the surface of the strained-silicon PMOS device of FIG. 1.
Figure 2:
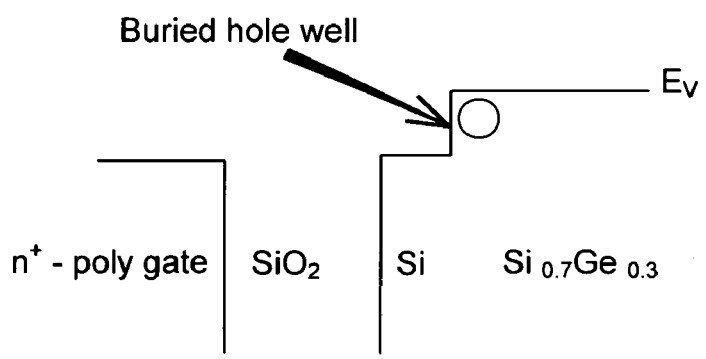

FIG. 2 illustrates an example equilibrium band-diagram for the surface of the strained-silicon PMOS device of FIG. 1. As shown, a valence band potential well exists in the relaxed SiGe layer. This band-offset results in a buried potential-well in PMOS devices, within which the holes will flow. Because it is buried (e.g. away from the oxide interface), the holes will experience decreased random trapping and de-trapping, which translates to a lower flicker noise in the device.

Figure 3:
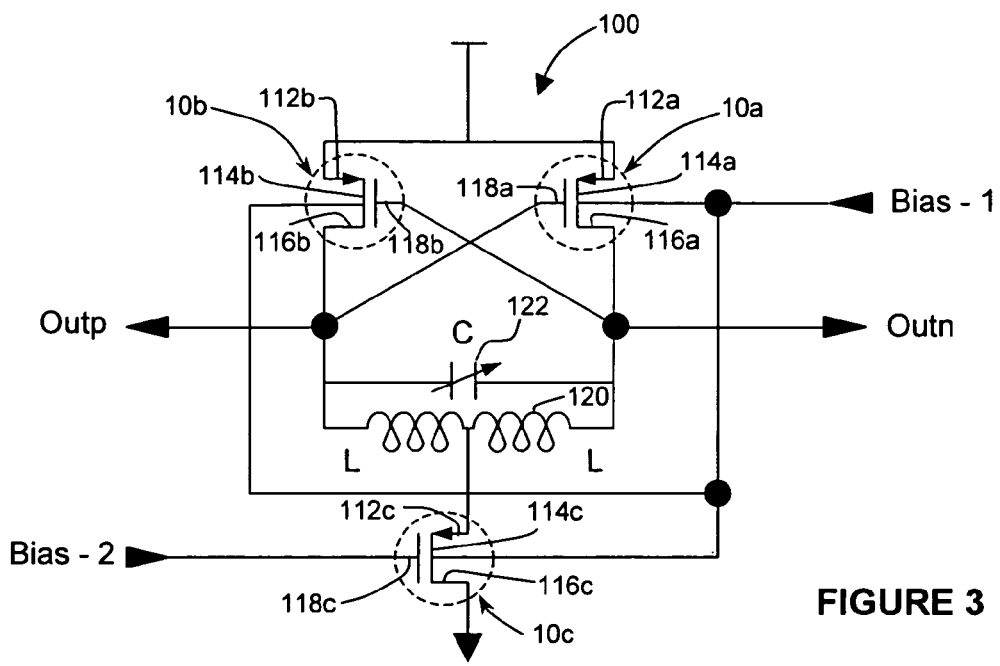
FIG. 3 illustrates a VCO in accordance with one embodiment of the invention.

FIG. 3 illustrates an example VCO in accordance with one embodiment of the invention. VCO 100 includes three strained-silicon PMOS devices (10a, 10b, 10c), an inductive element 120, and a capacitive element 122 coupled together as shown, although the scope of the invention is not limited in this regard. In particular, PMOS device 10a and PMOS device 10b are depicted as being cross-coupled. That is, the gate region 118a of strained-silicon PMOS device 10a is coupled to the drain region 116b of strained-silicon PMOS device 10b, and the gate region 118b of strained-silicon PMOS device 10b is coupled to the drain region 116a of strained-silicon PMOS device 10a. Additionally, the source terminals 112a and 112b of the strained-silicon PMOS devices 10a and 10b are coupled together, while capacitive element 122 and inductive element 120 are coupled to each of the drain regions of the strained-silicon PMOS devices 10a and 10b. Furthermore, the source region 112c of strained-silicon PMOS device 10c is coupled to inductive element 120 as a tail-current source to the VCO.

In accordance with one embodiment of the invention, the bodies (114a–114c) of each of the illustrated strained-silicon PMOS devices (10a–10c, respectively) are coupled to a bias voltage source (Bias-1) to facilitate increased buried channel transport within the strained-silicon devices (10a, 10b, 10c) and in turn, decreased flicker noise. Similarly, the tail-current flowing through strained-silicon PMOS device 10c may be controlled through the application of a second bias voltage source (Bias-2) to the gate region 118c of the strained-silicon PMOS device 10c. In one embodiment, either bias voltage source (e.g., bias-1 or bias-2) may be coupled to external decision making/feedback circuitry (not shown) to provide dynamic voltage control of the strained-silicon devices 10a–10c. For example, external decision making/feedback circuitry may be used to determine a system figure of merit (such as adjacent channel power) to determine whether the flicker (or phase) noise is approaching an unacceptable level. In response, the decision making/feedback circuitry may cause the bias-1 voltage to become more negative so as to attract more holes away from the surface, thus reducing system noise.

Although in the illustrated embodiment, each of the PMOS devices of VCO 100 have been described as being stained-silicon PMOS devices, one or more of the strained-silicon PMOS devices (10a, 10b, 10c) may nonetheless represent a conventional PMOS device (e.g., not containing strained-silicon) without departing from the spirit and scope of the invention.

Figure 4:
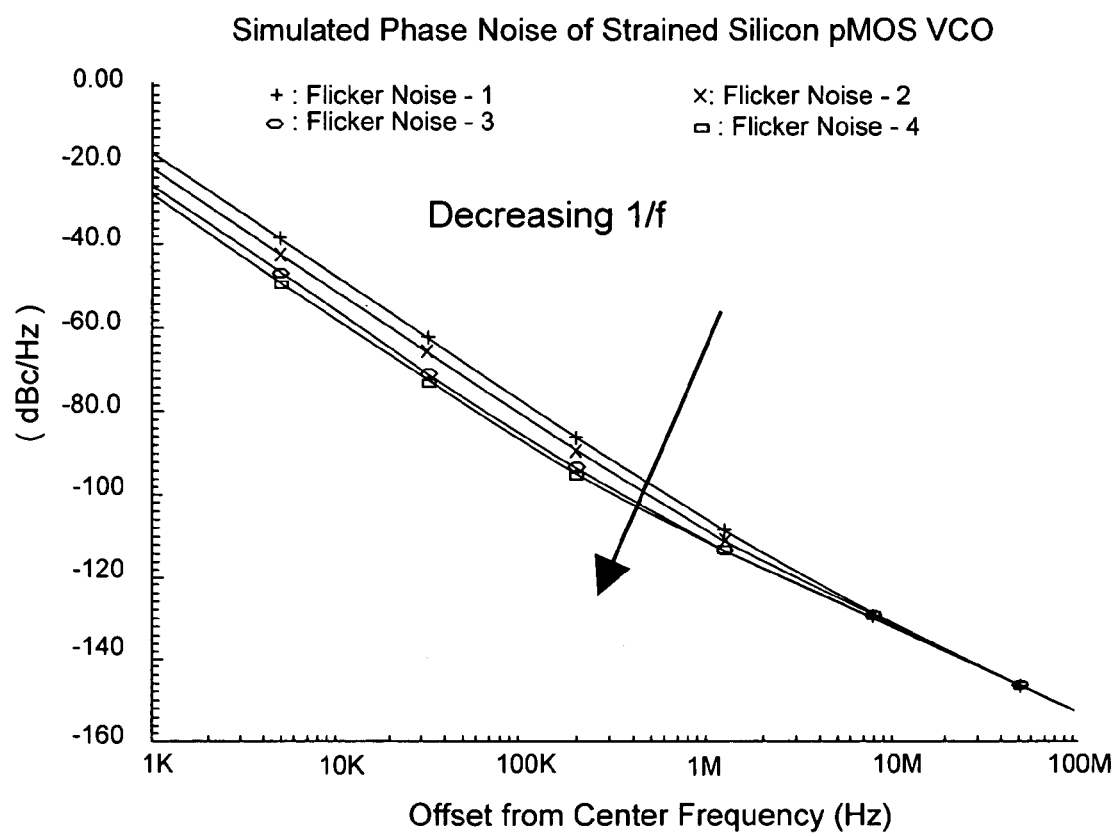
FIG. 4 is a graph illustrating simulated phase-noise within the VCO of FIG. 3.

FIG. 4 is a graph illustrating simulated phase-noise within the VCO 100 of FIG. 3. Referring to FIG. 4, it can be seen that an improvement in the phase noise of the VCO 100 occurs when lower flicker noise coefficients, representing the strained-silicon devices 10a–10c described above are used. The use of different flicker noise coefficients attempts to approximate the device level effects of buried channel hole transport.

Figure 5:
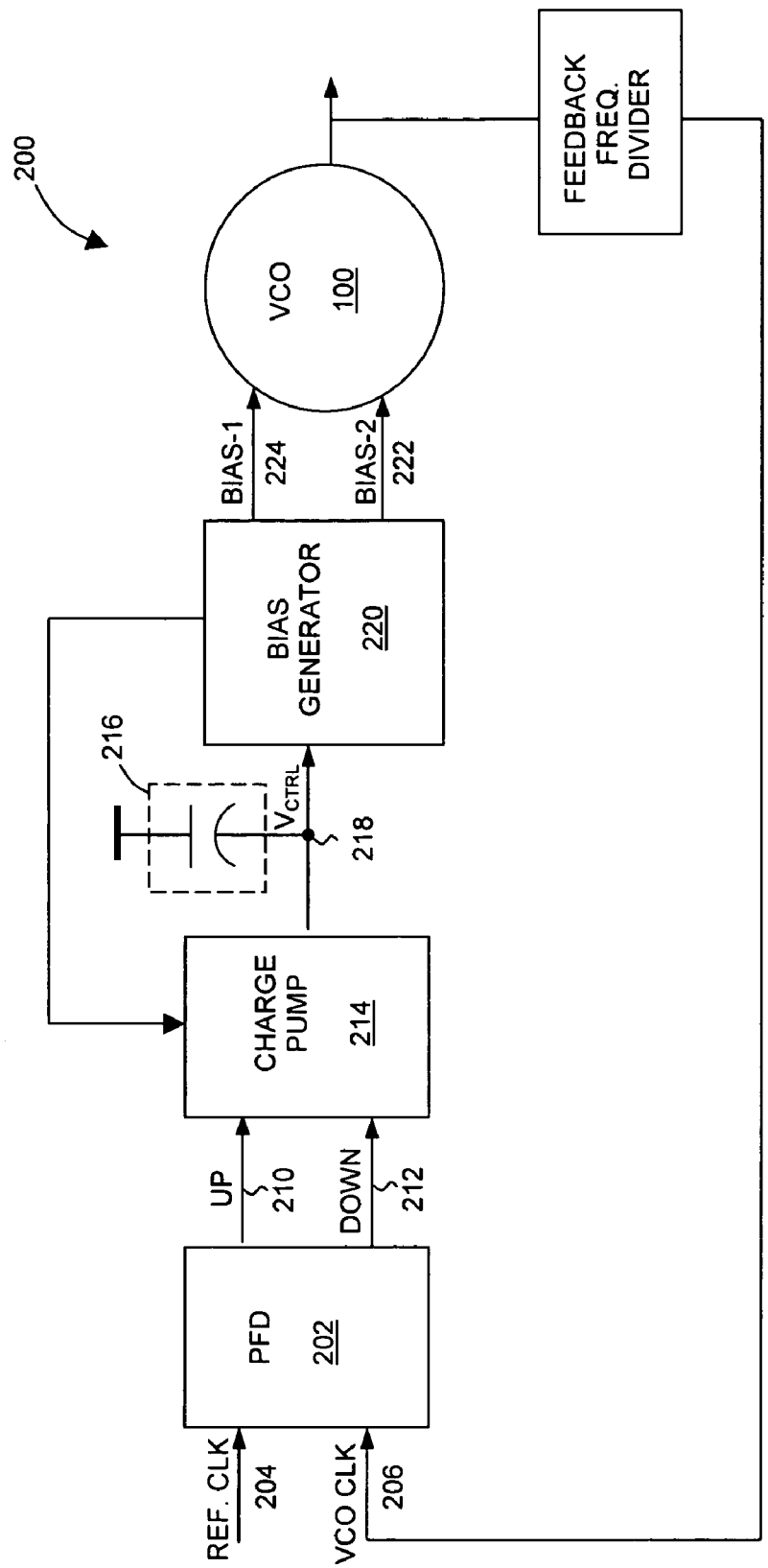
FIG. 5 illustrates an example phase-locked loop (PLL) including a VCO equipped with one or more strained-silicon PMOS devices in accordance with one embodiment of the invention.

FIG. 5 illustrates an example phase-locked loop (PLL) 200 including a VCO 100 equipped with one or more strained-silicon PMOS devices in accordance with one embodiment of the invention. As shown, PLL 200 includes a phase-frequency detector (PFD) 202 for monitoring a phase difference between a reference signal 204 and a feedback clock signal 206 (in the form of a frequency divided output signal of a voltage-controlled oscillator (VCO) 100). The PFD 202 generates an UP control signal 210 and a DOWN control signal 212 to cause a charge pump 214 to respectively charge and discharge a loop filter 216. The loop control voltage 218 developed across the loop filter 216 determines the output frequency of the VCO 100. Furthermore, the UP and DOWN control signals 210, 212 driving the charge pump 214 set the proper loop filter control voltage 218 to maintain a minimal phase error between the input signals applied to the PFD 202. Additionally, the bias generator 220 generates two bias voltages, B$_{IAS}$-1 and B$_{IAS}$-2. In one embodiment, Bias-2 controls the tail-current through strained-silicon PMOS device 10c and the output of VCO 100. In one embodiment, Bias-1 is coupled to the bodies of strained-silicon PMOS devices 10a–10c and controls the amount of buried channel transport through the respective devices. In one embodiment, as bias-1 is made more negative, buried channel transport through strained-silicon PMOS devices 10a–10c is increased causing a corresponding decrease in phase noise in PLL 200.

Figure 6:
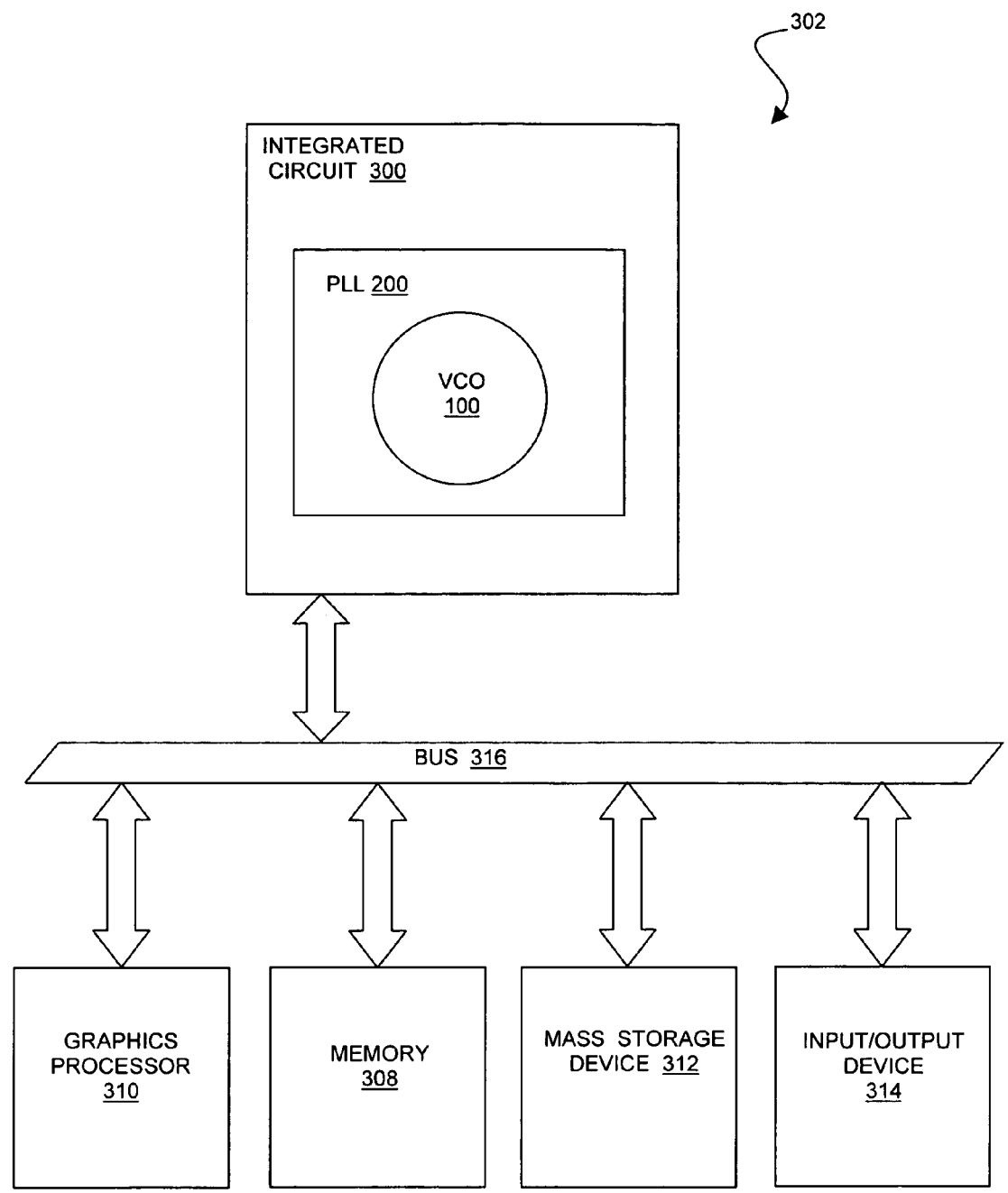
FIG. 6 illustrates a system in which the PLL circuit of FIG. 5 is used.

FIG. 6 illustrates one of many possible systems in which a PLL circuit incorporated with a VCO endowed with one or more strained-silicon PMOS devices in accordance with one or more embodiments of the invention may be used. The VCO 100 (described with respect to FIG. 3) is implemented in a PLL circuit 200 (described with respect to FIG. 5) as part of an integrated circuit (IC) 300. In one embodiment, IC 300 is a microprocessor. However, in alternate embodiments, IC 300 may be an application specific IC (ASIC).

For the embodiment depicted in FIG. 6, the system 302 also includes a main memory 308, a graphics processor 310, a mass storage device 312 and an input/output module 314 coupled to each other by way of a communication channel 316, as shown. Examples of the memory 308 include but are not limited static random access memory (SRAM) and dynamic random access memory (DRAM). Examples of the mass storage device 312 include but are not limited to a hard disk drive, a compact disk drive (CD), a digital versatile disk drive (DVD), and so forth. Examples of the input/output module 314 include but are not limited to a keyboard, cursor control devices, a display, a network interface, and so forth. Communication channel 316 may represent one or more wired and/or wireless communication channels including but not limited to a peripheral control interface (PCI) bus, an Industry Standard Architecture (ISA) bus, and so forth. In various embodiments, the system 302 may be a wireless mobile phone, a personal digital assistant, a pocket PC, a tablet PC, a notebook PC, a desktop computer, a set-top box, an entertainment unit, a DVD player, and a server.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A voltage controlled oscillator (VCO) comprising:
a first PMOS device having a strained-silicon layer;
wherein the first PMOS device comprises a source region, a drain region, a gate region and a body; and
wherein the body is coupled to a bias voltage source to increase buried channel conduction within at least the first PMOS device so as to reduce flicker noise within the VCO.

2. A voltage controlled oscillator (VCO) comprising:
a first PMOS device having a strained-silicon layer;
a second PMOS device having a strained-silicon layer and cross-coupled to the first PMOS device.

3. The VCO of claim 2, wherein the first PMOS device comprises a first source region, a first drain region, a first gate region and a first body;
wherein the second PMOS device comprises a second source region, a second drain region, a second gate region and a second body; and
wherein the second gate region is coupled to the first drain region and the second drain region is coupled to the first gate region.

4. The VCO of claim 3, wherein the first and second bodies are coupled to a first bias voltage source to increase buried channel conduction within the first and second PMOS devices so as to reduce flicker noise within the VCO.

5. The VCO of claim 4, further comprising:
a third PMOS device having a strained-silicon layer, a third source region, a third drain region, a third gate region and a third body, the third PMOS device to provide a tail-current source to the VCO.

6. The VCO of claim 5, wherein first, second and third bodies are coupled to a first bias voltage source to increase buried channel conduction within the first, second and third PMOS devices so as to reduce flicker noise within the VCO.

7. The VCO of claim 5, wherein the third gate region is coupled to a second bias voltage source to control the tail current through the third PMOS device.

8. The VCO of claim 5, further comprising at least one inductive element and at least one capacitive element each coupled between the first drain region and the second drain region.

9. A voltage controlled oscillator (VCO) comprising:
at least a first strained-silicon PMOS device having a first source, a first drain, a first gate and a first body; and
a control bias coupled to the first body to increase buried channel conduction within the first PMOS device so as to reduce flicker noise within the VCO.

10. The VCO of claim 9, further comprising:
a second strained-silicon PMOS device having a second source, a second drain, a second gate and a second body; and a third strained-silicon PMOS device having a third source, a third drain, a third gate and a third body;

wherein the control bias is coupled to the second and third bodies to increase buried channel conduction within the second and third respective PMOS devices so as to further reduce flicker noise within the VCO.

11. The VCO of claim 10, wherein the second gate is coupled to the first drain and the second drain is coupled to the first gate.

12. The VCO of claim 11, further comprising a second control bias coupled to the third strained-silicon PMOS device to modulate tail-current through the third strained-silicon PMOS device.

13. The VCO of claim 12, further comprising at least one inductive element and at least one capacitive element each coupled between the first drain and the second drain.

14. A system comprising:

a communication channel;

a dynamic random access memory (DRAM); and an integrated circuit (IC) coupled to the DRAM via the communication channel, the IC having a phase locked loop (PLL) to generate an output clock signal, the PLL including a voltage controlled oscillator (VCO) comprising at least a first strained-silicon PMOS device having a first gate, a first drain, and a first body terminal, and a control bias coupled to the first body terminal to increase buried channel conduction within the first strained-silicon PMOS device so as to reduce flicker noise within the VCO.

15. The VCO of claim 14, further comprising:

a second strained-silicon PMOS device having a second drain, a second gate and a second body terminal, wherein the second gate is coupled to the first drain and the second drain is coupled to the first gate.

16. The system according to claim 14, wherein the integrated circuit further includes a central processing unit, a main memory coupled to the central processor unit and at least one input/output module coupled to the central processor unit and the main memory.

17. The system of claim 14, wherein the integrated circuit comprises a microprocessor.

18. The system of claim 14, further comprising a networking interface coupled to the communication channel.

19. The system of claim 14, wherein the system comprises a selected one of a set-top box, an entertainment unit and a DVD player.

* * * * *